United States Patent
Huang et al.

(10) Patent No.: US 8,974,655 B2
(45) Date of Patent: Mar. 10, 2015

(54) METHODS OF PLANARIZATION AND ELECTRO-CHEMICAL MECHANICAL POLISHING PROCESSES

(75) Inventors: Wayne Huang, Boise, ID (US); Whonchee Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1199 days.

(21) Appl. No.: 12/054,077

(22) Filed: Mar. 24, 2008

(65) Prior Publication Data

US 2009/0239379 A1 Sep. 24, 2009

(51) Int. Cl.
*C25F 3/16* (2006.01)
*B23H 5/08* (2006.01)
*H01L 21/321* (2006.01)

(52) U.S. Cl.
CPC .. *C25F 3/16* (2013.01); *B23H 5/08* (2013.01); *H01L 21/32125* (2013.01)
USPC .......................................... 205/647; 205/663

(58) Field of Classification Search
USPC ................................................ 205/647, 663
See application file for complete search history.

(56) References Cited

U.S. PATENT DOCUMENTS

| | | | |
|---|---|---|---|
| 5,300,155 A | 4/1994 | Sandhu et al. | |
| 5,676,587 A | 10/1997 | Landers et al. | |
| 6,040,245 A | 3/2000 | Sandhu et al. | |
| 6,375,552 B1 | 4/2002 | Cadien et al. | |
| 6,448,182 B1 | 9/2002 | Hall et al. | |
| 6,867,448 B1 | 3/2005 | Lee et al. | |
| RE39,126 E | 6/2006 | Yu et al. | |
| 7,112,121 B2 | 9/2006 | Lee et al. | |
| 7,153,410 B2 | 12/2006 | Moore et al. | |
| 7,160,176 B2 | 1/2007 | Lee et al. | |
| 7,220,166 B2 | 5/2007 | Lee et al. | |
| 2002/0058469 A1 | 5/2002 | Pinheiro et al. | |
| 2002/0125460 A1 | 9/2002 | Tredinnick | |
| 2004/0092102 A1 | 5/2004 | Li et al. | |
| 2005/0044803 A1 | 3/2005 | Siddiqui et al. | |

(Continued)

FOREIGN PATENT DOCUMENTS

EP 0848417 A1 6/1998
KR 20030050782 6/2003

(Continued)

OTHER PUBLICATIONS

Chen et al., "Optimized Process for Tungsten Chemical-Mechanical Planarization Throughput Improvement", Taiwan Semiconductor Manufacturing Co., Ltd., The Ninth International Symposium on Semiconductor Manufacturing, Publication Date: 2000, pp. 407-410.

(Continued)

*Primary Examiner* — Nicholas A Smith
(74) *Attorney, Agent, or Firm* — Wells St. John P.S.

(57) ABSTRACT

A method of removing a material from a surface includes providing a substrate comprising a material having a surface, contacting the surface with a polishing medium, applying a voltage to the substrate to remove material from the surface, and changing the voltage during the removing material from the surface. An electro-chemical mechanical polishing method includes providing a substrate having a surface, applying a platen to the surface, applying a first voltage to the substrate, rotating the platen and surface relative to each other at a first rotational speed, increasing to a second voltage, and decreasing to a second rotational speed.

20 Claims, 4 Drawing Sheets

(56) References Cited

U.S. PATENT DOCUMENTS

| | | |
|---|---|---|
| 2005/0059324 A1 | 3/2005 | Lee et al. |
| 2005/0196963 A1 | 9/2005 | Lee |
| 2005/0211952 A1 | 9/2005 | Mace et al. |
| 2005/0214191 A1 | 9/2005 | Mueller et al. |
| 2006/0021974 A1 | 2/2006 | Liu et al. |
| 2006/0042956 A1 | 3/2006 | Lee et al. |
| 2006/0117667 A1 | 6/2006 | Siddiqui et al. |
| 2006/0118760 A1 | 6/2006 | Yang et al. |
| 2006/0169674 A1 | 8/2006 | Mao et al. |
| 2006/0196778 A1* | 9/2006 | Jia et al. ......... 205/640 |
| 2006/0270235 A1 | 11/2006 | Siddiqui et al. |
| 2007/0075042 A1 | 4/2007 | Siddiqui et al. |
| 2007/0102303 A1 | 5/2007 | Tran et al. |

FOREIGN PATENT DOCUMENTS

| | | |
|---|---|---|
| TW | 544370 B | 8/2003 |
| WO | 2006114416 A1 | 11/2006 |

OTHER PUBLICATIONS

Wang, et al., "Development of Slurry Concentration Adjustable Tungsten Chemical Mechanical Planarization Process", Technology Development, Chartered Semiconductor Manufacturing Ltd., Advanced Semiconductor Manufacturing Conference, 2000 IEEE/SEMI, Publication Date: 2000, pp. 422-424.

Min Soo Lim, "Fundamental studies of chemical mechanical planarization (cmp) processes of tungsten and copper", A Dissertation Presented to the Department of Chemistry, University of Houston in Partial Fulfillment of the Requirements for the Degree of Doctor of Philosophy, Aug. 2002.

* cited by examiner

METHODS OF PLANARIZATION AND ELECTRO-CHEMICAL MECHANICAL POLISHING PROCESSES

TECHNICAL FIELD

Embodiments pertain to methods of removing material from a surface, an electrochemical mechanical polishing process and electrochemical mechanical polishing methods.

BACKGROUND

Metallic materials are important for features of semiconductor fabrication. For example, refractory metals are important due to their low contact resistance. As used herein, refractory metals include, for example, Ti, W, Ta, Mo, various alloyed combinations and such metals with other trace metals as known in the semiconductor art. Additionally, important metals in the semiconductor field include "noble metals" including for example, Pt, Pd, Ir, Ru, Rh, Os, Ag, Au, various alloyed combinations and combinations with trace metals as known in the semiconductor art as long as such alloys retain the physical and chemical properties of noble metals.

Often during semiconductor fabrication formation of metal features includes deposition of metal followed by a removal procedure or planarization step. Such planarization techniques can include, for example, chemical mechanical polishing (CMP), electromechanical polishing (EMP), or electro-chemical mechanical polishing (ECMP). However, conventional planarization techniques often provide incomplete planarization and/or formation of recess areas across a feature surface. It is desirable to develop alternative planarization techniques.

DETAILED DESCRIPTION OF THE ILLUSTRATED EMBODIMENTS

Figure 1:
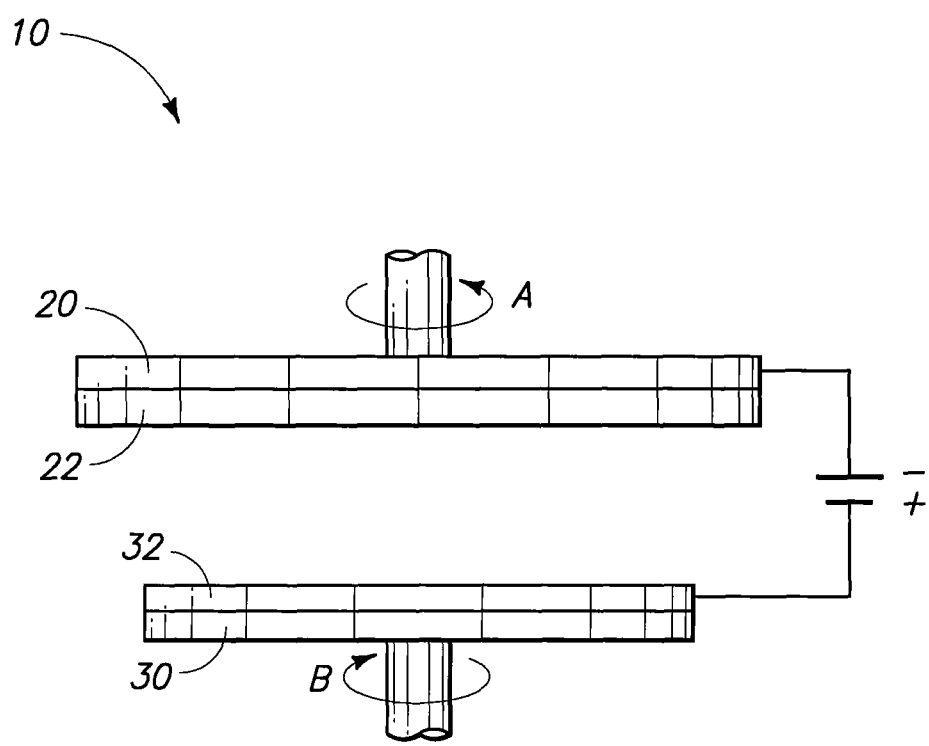
FIG. 1 is an illustration of an exemplary electrochemical mechanical polishing apparatus according to an embodiment of the present invention.

A variety of planarization techniques are currently utilized in attempt to planarize metal features on semiconductor substrates. In the context of this document, the term "semiconductor substrate" or semiconductive substrate" is defined to mean any construction comprising semiconductive material, including but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including but not limited to, the semiconductive substrates described above.

Metallic materials utilized for features in semiconductor substrates include, for example, refractory metals such as titanium (Ti), tungsten (W), tantalum (Ta), and molybdenum (Mo) in their elemental form and various alloyed combinations and additionally such refractory metals in combination with trace metals as long as such alloy retains the physical and chemical properties of refractory metals. Additional metals commonly used include "noble metals" including, but not limited to, platinum (Pt), palladium (Pd), iridium (Ir), ruthenium (Ru), rhodium (Rh), osmium (Os), silver (Ag), gold (Au) and alloys and combinations with trace metals as long as such alloys retain the physical and chemical properties of the noble metals. Additional metallic materials that are subject to various planarization techniques include nitrides of the refractory metals. Although embodiments are described primarily with respect to planarization of tungsten, it is to be understood that the methodology and processes described herein can equally be applied to any of these additional metallic materials.

One conventional planarization technique that has been utilized for planarization of metallic materials is chemical mechanical polishing (CMP). During a CMP process, a CMP system is utilized including a polishing pad and a chemical polishing medium. One or both of the polishing pad and the polishing medium contains an abrasive material. The workpiece, such as a semiconductive wafer, and the polishing pad are moved relative to one another such as by rotation of either or both of the wafer and the polishing pad. Such movement allows mechanical abrasive removal of metallic material from the wafer. During traditional CMP tungsten removal, for example, chemical passivation (formation of $WO_x$) occurs at the surface. Mechanical polishing removes the $WO_x$, repassivation of W occurs on the surface and $WO_x$ is again removed by mechanical polishing. Repeated rounds of chemical mechanical polishing results in removal of the tungsten material.

A recently developed technique for planarization of metallic materials is electro-chemical mechanical polishing (ECMP). Conventional ECMP has utilized a constant voltage applied to the wafer during the polishing process. Electrolytic and chemical passivation is utilized and mechanical abrasion removes the passivated material. Abrasive material can be provided in the electrolytic fluid, in the polishing pad, or both.

Each of the techniques above has one or more of the following drawbacks: incomplete planarization, varied planarization across a wafer, varied planarization with feature density, feature dishing and/or erosion, a need for high down force, island formation, etc.

In embodiments described herein, ECMP is performed with at least one voltage change during the overall ECMP processing. Various described embodiments allow all the advantages of ECMP (low down force, lack of island formation, etc.) with improved planarity across the wafer and decreased dependence upon feature density with highly efficient planarization and high removal rate relative to conventional ECMP techniques.

Referring to FIG. 1, an example ECMP system 10 which can be utilized for embodiments of the invention is shown. System 10 can have a platen 20 which can be rotatable in a first direction A. It is to be understood that first direction A is an example direction for purposes of the present description only. A polishing pad 22 can be associated with platen 20. Pad 22 may comprise abrasive particles (not shown). Alternatively, or additionally, abrasive particles may be provided in an electrolytic fluid.

System 10 further includes a substrate holder 30 which may be rotatable in a second direction B. In operation during ECMP processing direction A is preferably opposing direction B. Alternatively either platen 20 or substrate holder 30 can be held stationary while the other is rotated. A substrate 32 such as, for example, a semiconductor wafer can be positioned on holder 30 as depicted in FIG. 1. An electrolytic fluid (with or without abrasive particles) is provided. A voltage is applied to the substrate as indicated to allow electro-chemical mechanical planarization to be performed.

Constant voltage studies utilizing tungsten under biased conditions where performed. Abrasion action was shown to be directly dependent on platen and carrier (substrate holder) rpm. Higher platen/carrier rpm has stronger abrasion action. Thus the ability to remove passivated tungsten ($WO_x$ film) occurs at a higher rate under higher platen/carrier rpm.

Studying voltage effects, higher voltages passivate the tungsten surface more quickly. This results in increased planarity and low removal rate. Lower voltages have less and slower passivation on tungsten surfaces. This results in lower planarity and increased removal rate.

Additional studies analyze the surface haze value. Increased haze correlates to rougher surface finish which represents minimal passivation and higher removal rates. Lower haze shows smoother surface finish which represents high passivation and lower removal rates. Referring to Table 1, such sets forth haze values for surface analysis (SP2) for a given platen and substrate (head) rpm values and applied voltages (where the platen and substrate are rotated in opposing directions).

TABLE 1

SP2 HAZE VALUE

| Applied voltage | Platen/head rpm | |
|---|---|---|
| | 7/9 rpm | 20/23 rpm |
| 2.9 V | 22.0 ± 16.8 | 90.3 ± 24.6 |
| 3.1 V | 0.62 ± 0.39 | 30.2 ± 10.6 |

The combination of applied voltage and rpm appears to modify the tungsten surface and enable varying removal and planary performances. The varying observations as a function of rpm and applied voltage are summarized in Table 2.

TABLE 2

Constant Voltage Performance Summary

| Applied voltage | Platen/head rpm | |
|---|---|---|
| | 7/9 rpm | 20/23 rpm |
| 2.9 V | High rate<br>60% step-height reduction<br>Non-uniform | Higher rate<br>25% step-height reduction<br>More uniform |
| 3.1 V | Lowest rate<br>85% step-height reduction<br>Non-uniform | Highest Rate<br>50% step-height reduction<br>More uniform |

Figure 2:
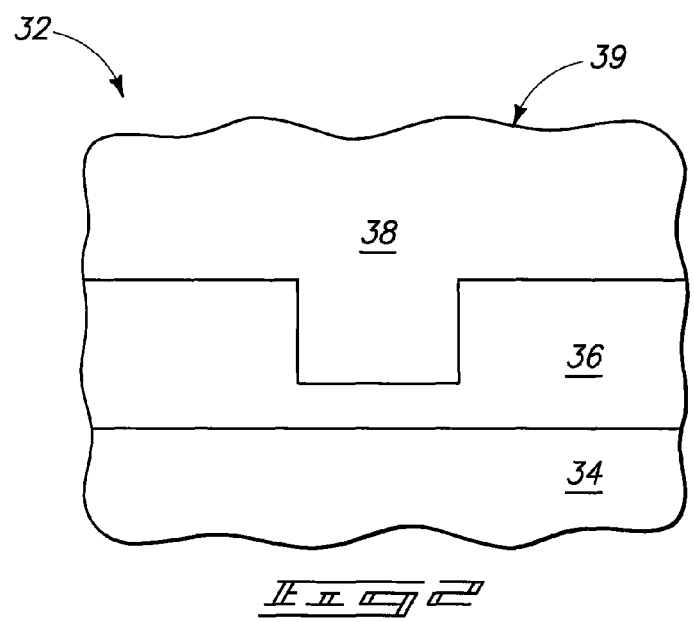
FIG. 2 is a fragmentary side view of a structure at an initial processing stage according to a method of one embodiment.
Figure 3:
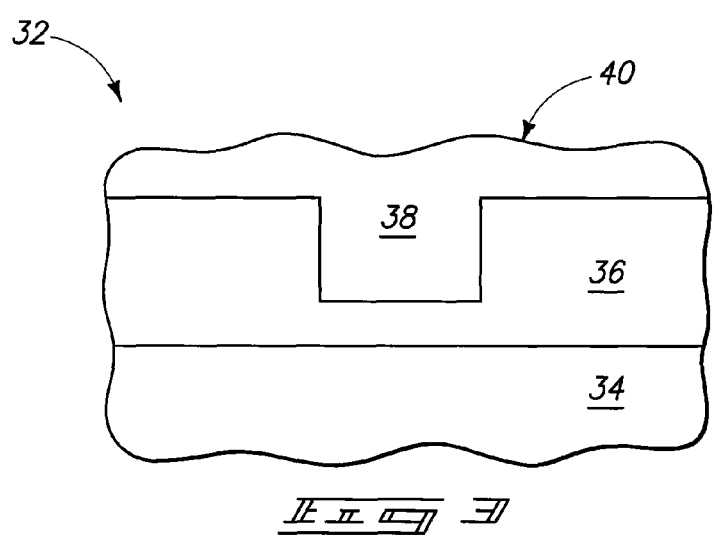
FIG. 3 is a fragmentary side view of the FIG. 2 structure at a stage subsequent to that shown in FIG. 2.
Figure 4:
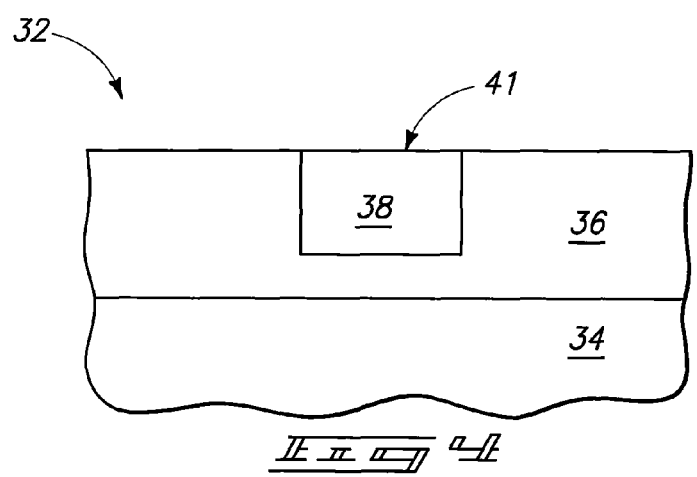
FIG. 4 is a fragmentary side view of the FIG. 2 structure at a stage of processing subsequent to that shown in FIG. 3.

An embodiment of the invention is described generally with reference to FIGS. 2-4. A substrate 32 is shown having a semiconductor material 34 over which a second material 36 such as an oxide material has been provided. A metallic material to be planarized, such as for example tungsten 38, overlies second material 36. Substrate 32 can be provided, for example, into system 10 as depicted in FIG. 1. An upper surface 39 of tungsten material 38 to be planarized can be contacted with a polishing medium, in this system including an electrolyte solution. The polishing medium may optionally comprise an abrasive/grit material. Mechanical polishing platen (feature 20 of FIG. 1) can be utilized to contact surface 39. A voltage is applied to substrate 32 to remove material from the surface. The platen, which may include a polishing pad (with or without abrasive particles) and the substrate can be rotated relative to one another. In particular embodiments the platen and substrate can be rotated in opposing directions relative to each other.

The initial voltage applied can be utilized to remove a portion of metallic material 38. Referring to FIG. 3, after removal of a portion of material 38 to produce surface 40 the voltage may be changed to a second voltage. The voltage change may be accompanied by a change in rpm of one or both of the platen and the substrate. Alternatively, the substrate and platen speed may be maintained. It is to be additionally noted that the speed of the rotation of the platen and/or substrate may be changed one or more times prior to altering the voltage. The voltage change may be made while the rotation of the platen and/or substrate is occurring, or alternatively rotation may be halted while the voltage change is made.

Once the voltage change has occurred ECMP can continue to a desired depth such as, for example, to achieve a feature surface 41 on a planar level equivalent to an upper surface of layer 36 as shown in FIG. 4. Alternatively, one or more additional voltage changes and/or rpm changes may be made during the continued ECMP processing.

It is to be noted that the voltage change from FIG. 2 to FIG. 3 can be an increased voltage or decreased voltage. Further, the various rotational speed changes can either be increased or decreased speeds.

Processing of two wafers W1 and W2 are set forth in Table 3. As indicated, two different platens were utilized. However, a single platen may be utilized and the voltage change may be conducted without halting rotation.

TABLE 3

WAFER PROCESS OVERVIEW

| | Platen 1 (P1) | | | Platen 2 (P2) | | |
|---|---|---|---|---|---|---|
| WAFER | Steps | Voltage | Platen/head rpm | Steps | Voltage | Platen/Head rpm |
| W1 | 1 | 3.1 | 7/9 | 1 | 2.9 | 10/13 |
| | 2 | 3.1 | 20/23 | | | |
| W2 | 1 | 2.9 | 20/23 | 1 | 2.9 | 10/13 |
| | 2 | 3.1 | 7/9 | 2 | 3.1 | 7/9 |
| | 3 | 3.1 | 20/23 | | | |
| | 4 | 3.1 | 7/9 | | | |

Processing of wafer W2 utilizing multiple voltage and rpm setting shows about 50% improvement in metal recess relative to constant voltage and rpm controls. During the processing of wafer W2, the first step is a low passivation step that removes oxide form from the tungsten deposition step. The second step is a high passivation step to protect the low-lying areas during high removal step mostly for large features. The third step is a high removal step to remove the bulk of the tungsten film. The fourth step is a high passivation step to protect large features and to enhance the planarity. Subsequently, an increased removal step is performed to almost completely clear the tungsten film. A final high passivation step to clear to the tungsten while protecting metal lines from excess recess below the dielectric is performed. This step is mostly for small features such as the array. By properly applying key passivation steps and removal steps throughout the processing significant improvement in wafer planarity was achieved. This multi-step process allows planarity across features at varying line width and pattern density.

Figure 5:
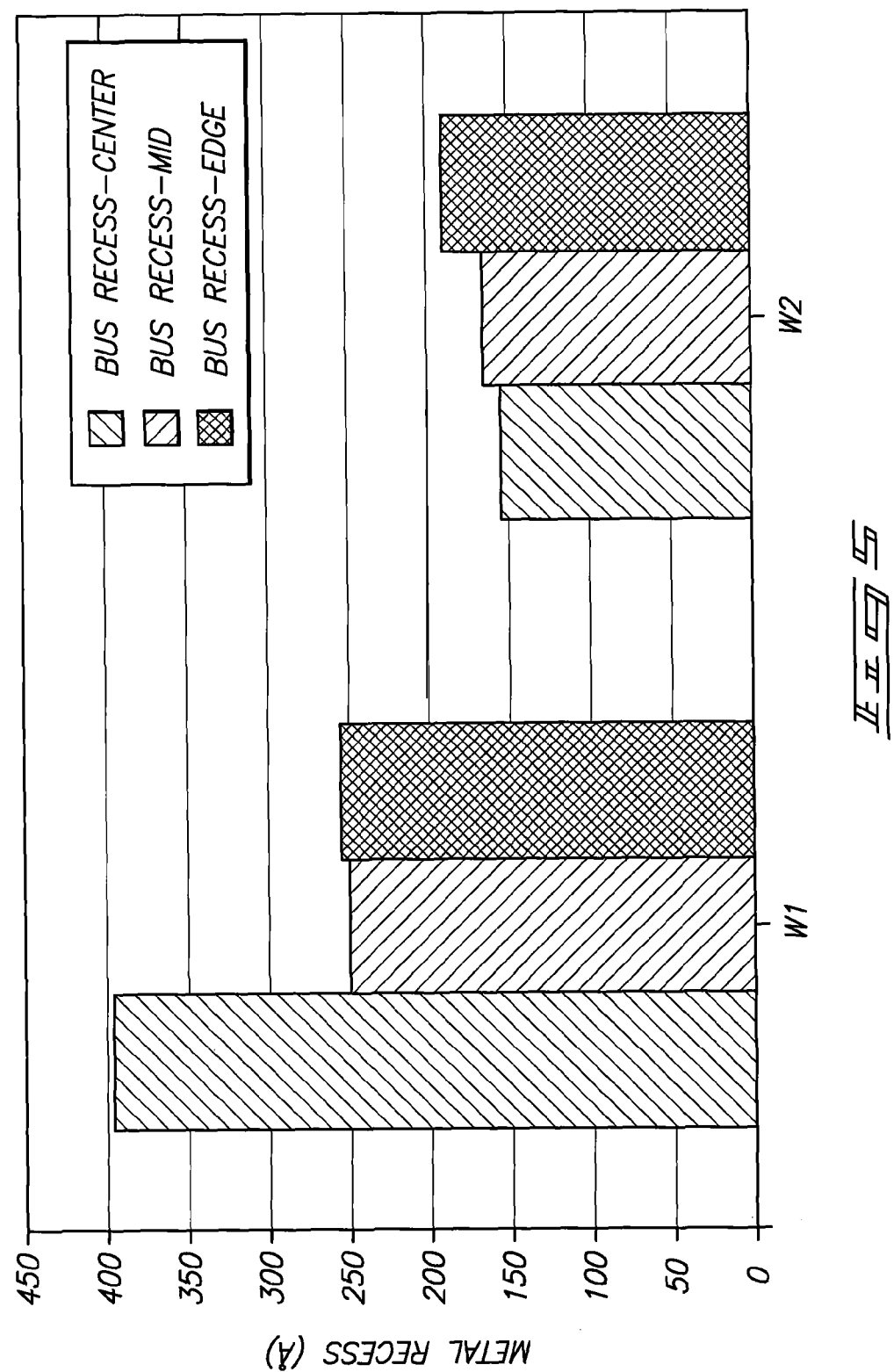
FIG. 5 shows metal feature recess for central, mid and edge of wafer locations.
Figure 6:
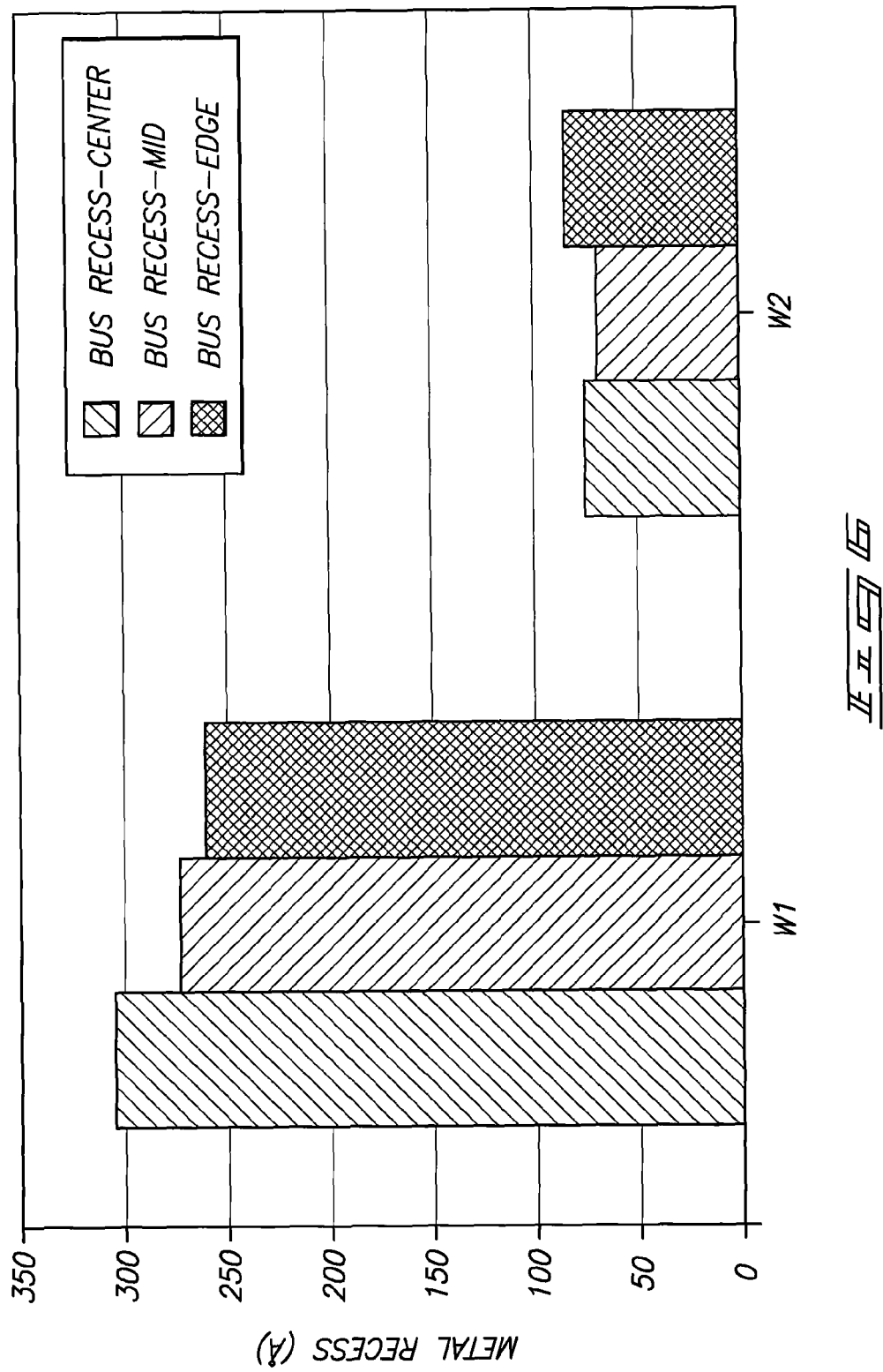
FIG. 6 shows array recess for central, mid and edge wafer locations.

Referring to FIGS. 5 and 6, such shows the results for W1 and W2 processing. The results indicated significantly decreased metal recess (angstroms) and increased consistency across the wafer relative to constant voltage and constant rpm controls. Properly applying key passivation steps and removal steps throughout ECMP processing achieve significant improvement in wafer planarity.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of removing a material from a surface, comprising: providing a substrate comprising a metallic material thereover, the metallic material having a surface, the metallic material comprising lone or more materials selected from the group consisting of Ti, Ta, Pt, Pd, Ru, Mo, W, Ir, Rh, Os, Ag, Au and mixtures thereof, optionally comprising trace elements; contacting the metallic surface with a polishing pad; applying a voltage directly to the substrate to remove material from the metallic surface; and changing the voltage during the removing material from the metallic surface; the method including a low passivation process followed by a first high passivation process, followed by a high removal process, followed by a second high passivation process.

2. The method of claim 1 further comprising contacting the surface with a mechanical polishing platen during the removing material from the surface.

3. The method of claim 2 wherein the platen and substrate are rotated relative to one another during at least a portion of the removing and wherein the changing the voltage occurs when the rotation is halted.

4. The method of claim 3 wherein rotation is resumed after the changing the voltage.

5. The method of claim 2 wherein the platen and substrate are rotated relative to one another during at least a portion of the removing and wherein the changing the voltage occurs during the rotation.

6. The method of claim 1 wherein the material is conductive.

7. The method of claim 1 wherein the material comprises a refractive metal.

8. The method of claim 1 wherein the metallic material comprises tungsten.

9. An electro-chemical mechanical polishing (ECMP) process comprising a metallic material to be planarized, the metallic material comprising, the metallic material comprising one or more materials selected from the group consisting of Ti, Ta, Pt, Pd, Ru, Mo, W, Ir, Rh, Os, Ag, Au and mixtures thereof, optionally comprising trace elements;
applying a first voltage directly to the substrate;
performing a chemical mechanical polishing (CMP) process to planarize the metallic material in the presence of the voltage; and
changing to a second voltage during the chemical mechanical polishing process; the ECMP process comprising a low passivation process followed by the high passivation process, followed by a high removal process.

10. The process of claim 9 wherein the second voltage is increased relative to the first voltage.

11. The process of claim 9 wherein the CMP comprises rotation of the substrate and a polishing pad relative to one another and wherein the rotation is halted during the changing.

12. The process of claim 9 wherein the CMP comprises rotation of the substrate and a platen relative to one another and wherein the rotation is not halted during the changing.

13. The process of claim 9 wherein the CMP comprises rotation of the substrate and a platen relative to one another and wherein speed of the rotation is altered during the process.

14. The process of claim 9 wherein the metallic material comprises W.

15. An electro-chemical mechanical polishing method comprising:
providing a substrate having a metallic material having a surface, the metallic material comprising one or more materials selected from the group consisting of Ti, Ta, Pt, Pd, Ru, Mo, W, Ir, Rh, Os, Ag, Au and mixtures thereof, optionally comprising trace elements;
applying a platen to the surface;
applying a first voltage directly to the substrate;
rotating the platen and surface relative to each other at a first rotational speed;
increasing to a second voltage; and
decreasing to a second rotational speed; the method comprising a low passivation process followed by a high passivation process, followed by a high removal process.

16. The method of claim 15 further comprising increasing to a third rotational speed.

17. The method of claim 16 further comprising decreasing to a fourth rotational speed.

18. The method of claim 15 wherein the substrate is a semiconductor wafer.

19. The method of claim 15 wherein the surface comprises a refractory metal.

20. The method of claim 15 wherein rotation of the platen and the substrate relative to one another is halted during the increasing.

* * * * *